United States Patent [19]

Fagan

[11] 4,103,348
[45] Jul. 25, 1978

[54] VOLATILE AND NONVOLATILE RANDOM ACCESS MEMORY CELL

[75] Inventor: John L. Fagan, Pasadena, Md.

[73] Assignee: Westinghouse Electric Corp., Pittsburgh, Pa.

[21] Appl. No.: 828,577

[22] Filed: Aug. 29, 1977

[51] Int. Cl.² .............................................. G11C 11/40
[52] U.S. Cl. .................................... 365/228; 307/238; 365/174; 365/182
[58] Field of Search ..... 340/173 R, 173 DR, 173 FF; 307/238, 279

[56] References Cited

U.S. PATENT DOCUMENTS 3,728,695  4/1973  Frohman-Bentchkowsky .... 340/173 VT

OTHER PUBLICATIONS

IBM Tech. Discl. Bul., vol. 17, No. 8, Jan. 1975, pp. 2314–2315, "Nonvolatile Memory Array w/ a Single Famos Device per Cell", R. C. Dockerty.

Primary Examiner—Terrell W. Fears
Attorney, Agent, or Firm—R. M. Trepp

[57] ABSTRACT

A random access memory cell for storing information in both volatile and nonvolatile form is described incorporating a dual gate variable threshold transistor, a capacitor, and three field effect transistors. The dual gate variable threshold transistor may include a fixed threshold and a variable threshold field effect transistor.

9 Claims, 6 Drawing Figures

VOLATILE AND NONVOLATILE RANDOM ACCESS MEMORY CELL

GOVERNMENT CONTRACT

The invention herein described was made in the course of or under a contract or subcontract thereunder with the Department of the Air Force.

BACKGROUND OF THE INVENTION

1. Field of the Invention

This invention relates to random access semiconductor memories particularly to a memory cell including both volatile and nonvolatile storage of information.

2. Description of the Prior Art

Volatile random access semiconductor memories have been built using bipolar and MOS transistors. Static semiconductor memories use flip-flops or cross-coupled inverters composed of bipolar or MOS transistors for each memory cell resulting in a memory that will hold the information in the memory cell so long as power supply voltages are maintained. The disadvantage of static memories is that each memory cell takes a lot of silicon area to fabricate resulting in large memory chips for a given memory size. In order to reduce the memory cell area, a simpler memory cell has been designed where the information is held in the memory cell by a charged capacitor which may be in the form of a capacitor or an expanded gate, source or drain electrode of a field effect transistor. The advantage of a simpler memory cell is that less silicon area is required per memory cell resulting in a smaller memory chip for a given number of storage bits. The disadvantage of using a capacitor to hold the information is that the charge stored on the capacitor tends to leak off through connecting circuit elements or through imperfect insulating barriers or their surfaces. Therefore, the capacitor holding the charge representing information needs to be periodically refreshed to restore the electrical charge on the capacitor as initially written. Memories utilizing a capacitor to hold the information may be referred to as dynamic memories to distinguish them from static memories. One example of a conventional dynamic memory cell utilizes a MOS transistor as a transmission gate to permit charge to be placed on a capacitor, a MOS transistor to be used as an inverter to sense the charge on the capacitor, and a MOS transistor used as a transmission gate to connect the output of the inverter to a data output line. The memory cell is periodically refreshed by the use of additional circuitry which periodically senses the information stored in the memory cell and rewrites the information back into the memory cell.

Both static and dynamic random access semiconductor memories have the disadvantage that when the circuit voltages are removed such as by turning off the power supply supplying the voltages to the memory cell, the information in the memory cell is lost. The information is lost because the voltages at key circuit nodes change with no assurance that when the power supply voltages are re-applied that the voltages will re-establish themselves as before. To prevent the loss of data from the memory cells in the event of loss of power supply voltages, a nonvolatile variable threshold transistor has been combined with the volatile memory cell which could store the information in nonvolatile form by a special write sequence which could be initiated at times the power supply voltages drop below a predetermined level. Information is not normally stored in the nonvolatile form due to the fact that the writing times are much longer than the times required to write the information in volatile form.

One example of a memory cell including volatile and nonvolatile storage of information is described in U.S. Pat. No. 3,761,901 issued on Sept. 25, 1973 to N. E. Aneshansley which utilizes two fixed threshold MOS transistors, a capacitor and a variable threshold field effect transistor. The variable threshold field effect transistor is used to hold nonvolatile information and at other times used to read or access volatile information from the memory cell. A major disadvantage of the memory cell such as shown in FIG. 2 is that when used in an array each row must be selected individually to write nonvolatile data. In addition, while the drain of the variable threshold field effect transistor is held at $-18$ volts, the gate may be at zero volts when its row is not selected and at $-18$ volts when selected. At the same time the drain may be at zero volts or at $-18$ volts depending upon the data stored on the gate of transistor 52. The voltages across the electrodes of the variable threshold field effect transistor may cause some read disturb effects to the preset condition or voltage threshold state of the variable threshold field effect transistor.

Another example of a memory cell which may store information in volatile and nonvolatile form is described in U.S. Pat. No. 3,774,177 issued on Nov. 20, 1973 to A. M. Schaffer. The memory cell is composed of two fixed threshold transistors, one variable threshold transistor and a capacitor. In Schaffer the variable threshold transistor is used as a transmission gate to place charge on the capacitor and to store the nonvolatile information at times when a write pulse is applied to its gate. With the memory cells arranged in an array such as shown in FIG. 3, it has a disadvantage in that only one row of memory cells may be written into at a time to store nonvolatile information. In addition, various voltages are placed across the gate, drain and source electrodes of the variable threshold field effect transistor during the operation of read and write of volatile and nonvolatile information.

Another memory circuit for storing volatile and nonvolatile information is described in U.S. Pat. No. 3,922,650 issued on Nov. 25, 1975 to A. M. Shaffer which describes a random access memory cell comprised of three capacitors, two fixed threshold field effect transistors and one variable threshold field effect transistor. One of the capacitor's capacitance varies as a function of the data and is used to read information out of another capacitor. The variable threshold transistor is also used to write data into the memory cell in volatile form, to refresh the (volatile) charge on a capacitor and to hold nonvolatile data by placing a negative write pulse on the gate. The disadvantage of the memory cell is that various voltages are placed across the gate and drain and source electrodes of the variable threshold transistor during operation of the memory cell.

It is therefore desirable to have a memory cell capable of storing volatile and nonvolatile information which does not depend upon the variable threshold transistor during reading or writing of volatile information.

It is further desirable that the variable threshold transistor be placed in the memory cell circuit at a point where voltages during operation of the memory for storing or reading volatile information does not cause excessive voltages to appear across the electrodes of the variable threshold transistor resulting in voltage threshold shifts or effects to the gate insulator.

It is further desirable that in an array of memory cells that the entire array may be written with nonvolatile information at one time.

It is further desirable that an entire array of memory cells may be cleared of the nonvolatile information at one time.

It is further desirable that the memory cell contain as few components as possible and require the least silicon area for its implementation to permit memory chips to contain many memory cells.

SUMMARY OF THE INVENTION

In accordance with the present invention, a random access memory cell for storing information in both volatile and nonvolatile form utilizing at least a volatile read line, nonvolatile read line, nonvolatile write line, first voltage supply line, volatile write line, data input line and data output line comprising: first, second and third field effect transistors each having a gate, source and drain electrode; a capacitor means having a first and second terminal, a dual gate variable threshold transistor means having at least a first and second gate, first source and first drain electrode, the drain electrode of the first transistor coupled to the gate electrode of the second transistor, the first terminal of the capacitor means and the source electrode of the variable threshold transistor, the drain electrode of the second transistor coupled to the source electrode of the third transistor and the drain electrode of the variable threshold transistor, the second terminal of the capacitor means coupled to a reference potential, the volatile read line coupled to the gate electrode of the third transistor, the nonvolatile read line coupled to the first gate electrode of the variable threshold transistor, the nonvolatile write line coupled to the second gate electrode of the variable threshold transistor for coupling a polarizing voltage and at other times a read voltage to the second gate electrode, the first voltage supply line coupled at times to the source electrode of the second transistor, the volatile write line coupled to the gate electrode of the first transistor, the data input line coupled to the source electrode of the first transistor, and the data output line coupled to the drain electrode of the third transistor.

The invention further provides a random access memory array for storing information in both volatile and nonvolatile form comprising a plurality of memory cells wherein each memory cell includes a dual gate variable threshold transistor means and wherein each memory cell is capable of storing information in volatile and nonvolatile form.

DESCRIPTION OF THE PREFERRED EMBODIMENTS

Figure 1:
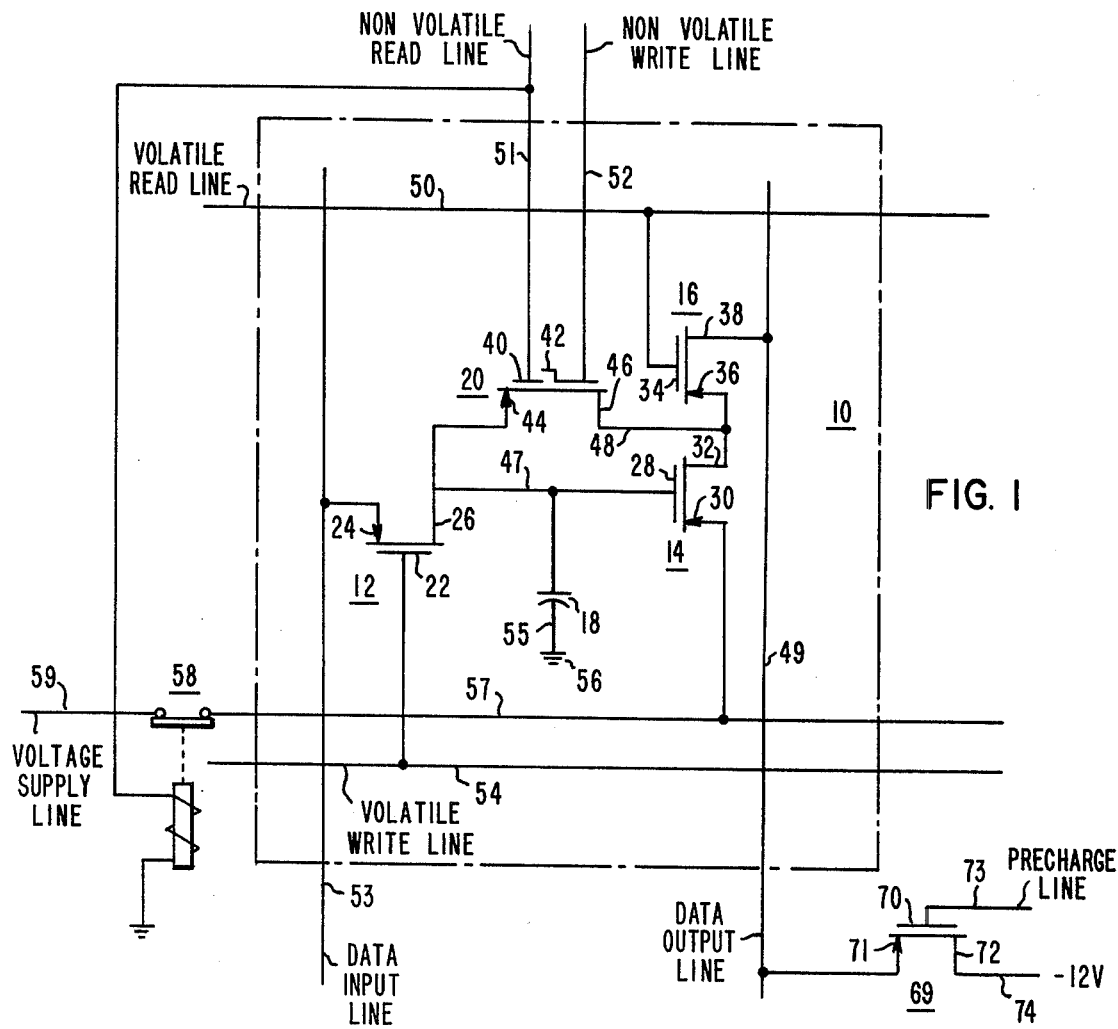
FIG. 1 is a circuit schematic of one embodiment of the invention.

Referring to FIG. 1, a circuit schematic of one embodiment of the invention is shown. Random access memory cell 10 includes three fixed threshold field effect transistors 12, 14 and 16, a capacitor means 18 having a first and second terminal and a dual gate variable threshold transistor means 20. Field effect transistor 12 has a gate electrode 22, a source electrode 24 and a drain electrode 26. Field effect transistor 14 has a gate electrode 28, a source electrode 30 and a drain electrode 32. Field effect transistor 16 has a gate electrode 34, source electrode 36 and drain electrode 38. The variable threshold transistor 20 has a first gate electrode 40, second gate electrode 42, source electrode 44 and drain electrode 46. The drain electrode 26 of transistor 12 is coupled over line 47 to the gate electrode 28 of transistor 14, to one side or first terminal of capacitor means 18 and to source electrode 44 of variable threshold transistor 20. The drain electrode 46 of variable threshold transistor 20 is coupled over line 45 to the drain electrode 32 of transistor 14 and to the source electrode 36 of transistor 16. The drain electrode 38 of transistor 16 is coupled to data output line 49 and to the source electrode 71 of field effect transistor 69 which functions to precharge data output line to −12 volts. Gate electrode 70 is coupled to precharge line 73 which functions to control when precharging occurs and drain electrode 72 is coupled over line 74 to a second voltage supply such as −12 volts. The gate electrode 34 of transistor 16 is coupled to volatile read line 50. The first gate electrode 40 of variable threshold transistor 20 is coupled to nonvolatile read line 51. The second gate electrode 42 of variable threshold transistor 20 is coupled to nonvolatile write line 52 which functions at times to place a polarizing voltage on gate electrode 42 to clear and to write data and at other times a voltage for reading the threshold voltage or state of transistor 20 in the region below gate electrode 42. The source electrode 24 of transistor 12 is coupled to data input line 53 which holds the data or voltage indicative of the data to be passed through transistor 12 and stored on capacitor means 18. The gate electrode 22 of transistor 12 is coupled to volatile write line 54 which functions to control transistor 12 by turning it on to the conducting or nonconducting state depending upon the voltage on line 54. Line 55 couples the other side or second terminal of capacitor means 18 to a reference potential 56 which may be, for example, ground potential. The source electrode 30 of transistor 14 is coupled to voltage supply line 57 which is coupled through switch 58 to voltage supply line 59. The control of switch 58 which functions to open or close switch 58 is coupled to nonvolatile read line 51. Switch 58 functions to open voltage supply line 57 at times when the nonvolatile data in variable threshold transistor 20 is being read in memory cell 10 by means of charging or not charging capacitor means 18. Capacitor means 18 may include gate electrode 28, for example, gate electrode 28 may be enlarged to increase its capacitance.

Memory cell 10 may be fabricated on a silicon substrate using standard integrated circuit processes. One method of making memory cell 10 on a silicon substrate would be to make the gate of transistors 12, 14, 16 and the gate electrode 40 of transistor 20 with polysilicon material. Gate electrode 42 of transistor 20 may be aluminum using a low temperature process with the highest process temperature being 500° C for the aluminum anneal. Transistors 12, 14, 16 and 20 may be P-channel enhancement mode field effect transistors. Likewise transistors 12, 14, 16 and 20 may be N-channel enhancement mode field effect transistors. Capacitor means 18 may include a layer of polysilicon material over a layer of insulation on the silicon substrate. Electrical contact to the polysilicon material may be made direct from the drain diffusion of electrode 26 of transistor 12.

Figure 2:
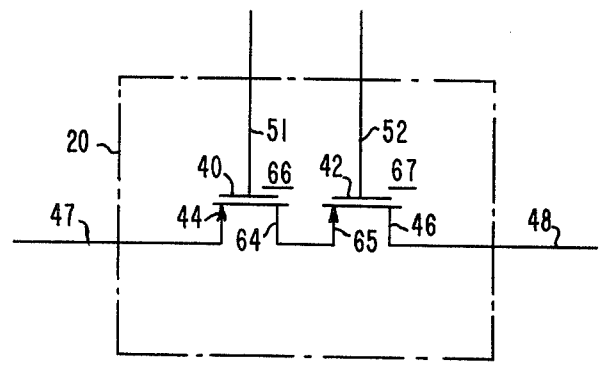
FIG. 2 is a circuit schematic of an alternate embodiment of a dual gate variable threshold transistor.

Referring to FIG. 2, variable threshold transistor 20 may include a second drain electrode 64 and source electrode 65 coupled together and located between gate electrode 40 and gate electrode 42 forming two field effect transistors 66 and 67. Transistor 66 would therefore have a gate electrode 40, source electrode 44 and drain electrode 64. Transistor 67 would have a gate electrode 42, a source electrode 65 and a drain electrode 46. Transistor 66 would have a fixed threshold voltage while transistor 67 would have a variable threshold voltage dependent upon the polarization voltage placed across the insulation layers in the region below gate electrode 42. Transistors 66 and 67 may be fabricated on a silicon substrate using integrated circuit processes. Transistors 66 and 67 could be self-aligned polysilicon gate devices which would make the required silicon area smaller and processing simpler than with other processes but would subject the gate dielectric of the variable threshold memory device to a high temperature such as 1000° C during processing when the silicon is oxidized. The high temperature such as 1000° C has a deleterious effect on the variable threshold transistor 67.

Figure 3:
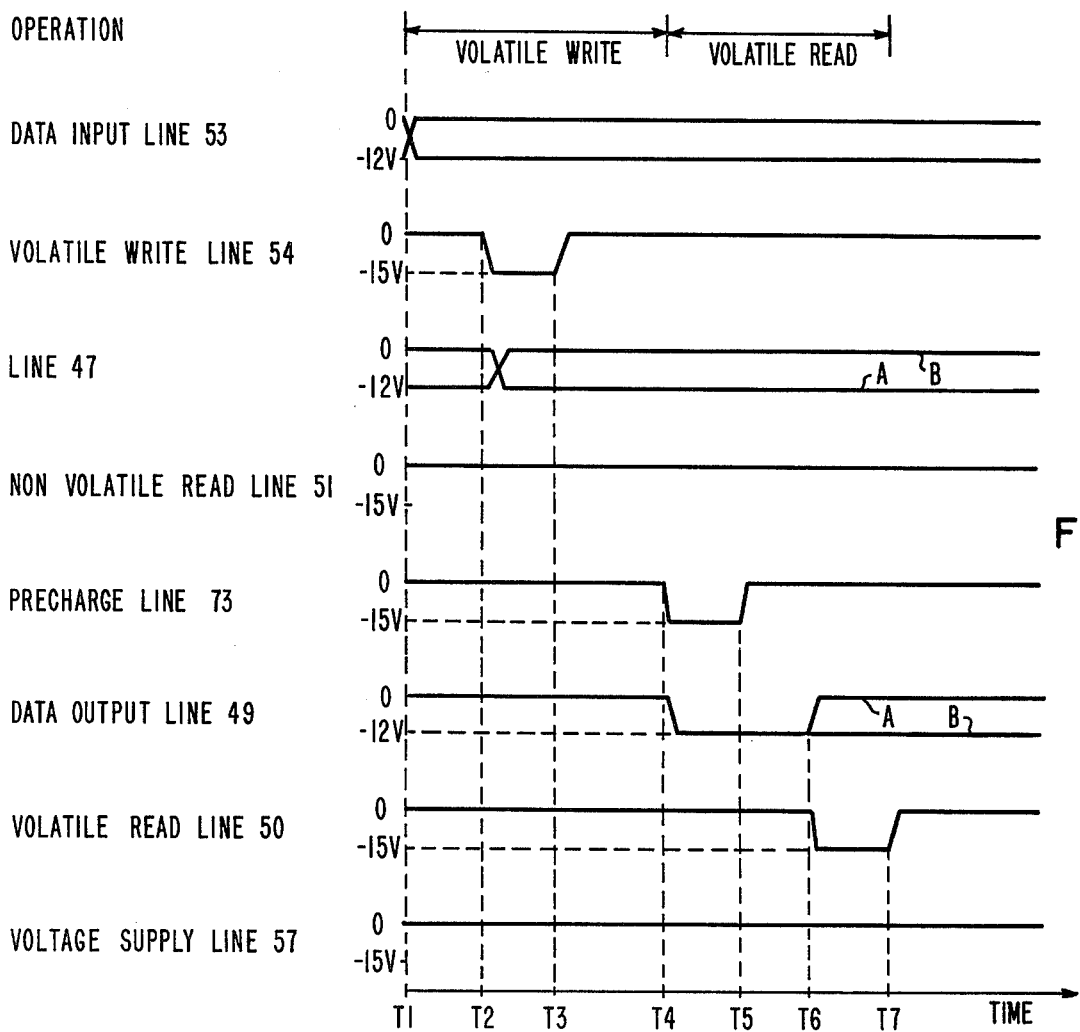
FIGS. 3 through 5 show circuit waveforms for reading, writing and clearing data in the embodiment of FIG. 1.
Figure 4:
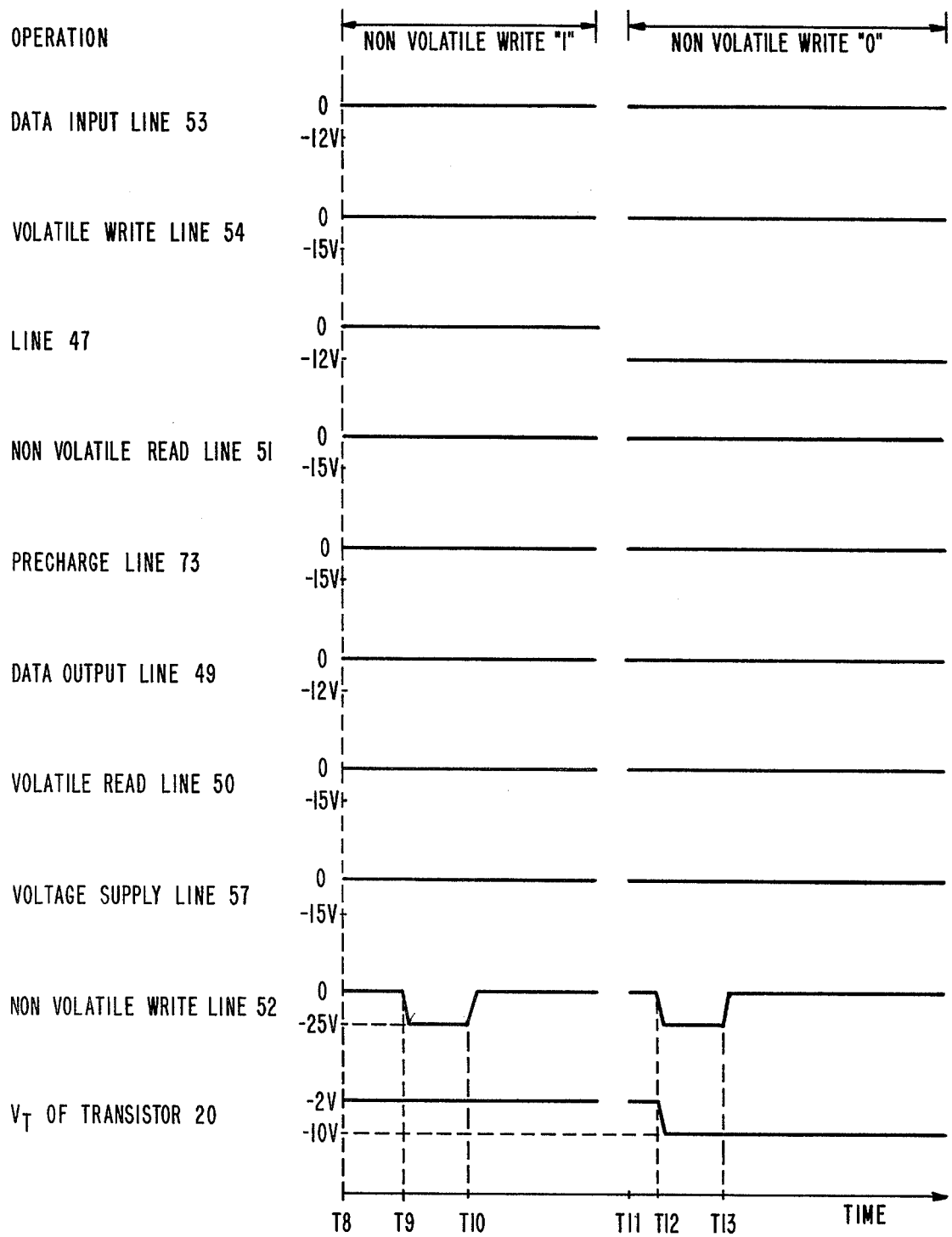
Figure 5:
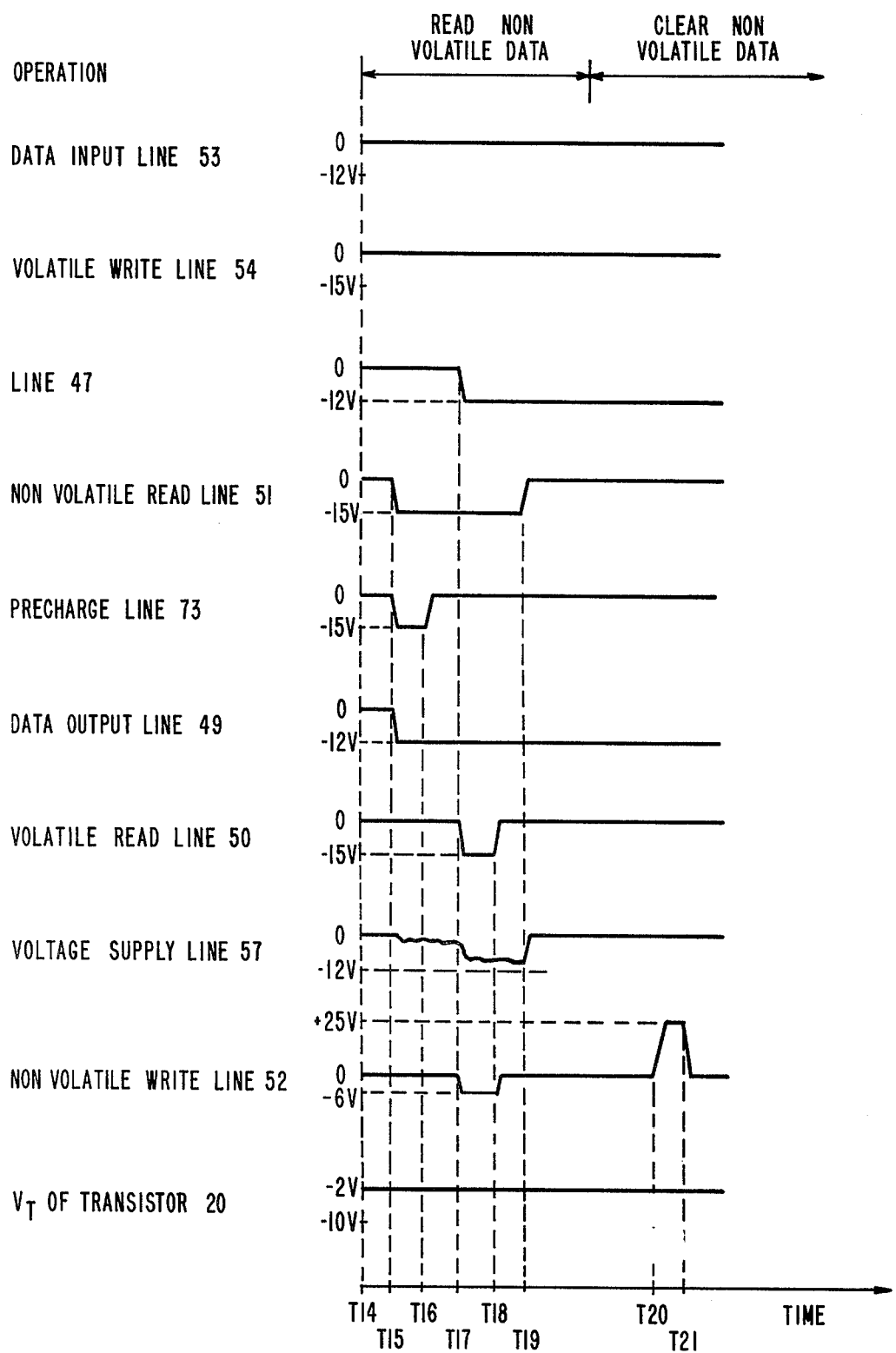

The operation of memory cell 10 as shown in FIG. 1 may be understood by reference to FIGS. 3 through 5 which show circuit waveforms for reading, writing and clearing data. In FIGS. 3 through 5, the ordinate for each waveform represents voltage and the abscissa represents time. FIG. 3 shows circuit waveforms for writing volatile data into memory cell 10. At T1 data input line 53 has a voltage level representing the data to be written, for example −12 volts may represent a logic zero and zero volts may represent a logic one. Switch 58 is closed which couples voltage supply line 57 to voltage supply line 59 which is at zero volts. At time T2 volatile write line 54 goes from zero volts to −15 volts which causes transistor 12 to be in the conducting state. In the conducting state, transistor 12 looks like a transmission switch and the data on data input line 53, its voltage level, passes through transistor 12 onto capacitor means 18 with line 47 being charged either to zero or −12 volts. The drain electrode of transistors 12, 14, 16 and 20 may act as the source electrode and the source electrode as the drain electrode, if the drain electrode is more positive than the source electrode. Nonvolatile read line 51 is at zero volts which holds transistor 20 in the nonconducting state to prevent leakage of charge off capacitor means 18 and line 47. At T3 voltage write line 54 goes from −15 volts to zero volts which puts transistor 12 into the nonconducting state and leaves line 47 isolated from data input line 53. The data that was on data input line 53 is now stored on capacitor means 18 of memory cell 10. During T1 through T3 the voltages on volatile read line 50, nonvolatile write line 52, data output line 49 and voltage supply line 57 are typically at zero volts but may be at other voltages so long as the voltage on capacitor 18 and line 47 is not interfered with.

In order to read the volatile data, the voltage on capacitor means 18 of memory cell 10, data output line 49 is precharged to −12 volts. At T4 precharge line 73 goes to −15 volts which causes transistor 69 to be in the conducting state which charges data output line 49 to −12 volts. At T5 precharge line 73 goes from −15 volts to zero volts which causes transistor 69 to be in a nonconducting state but which leaves data output line 49 precharged to −12 volts. Nonvolatile read line 51 remains at zero volts which causes switch 58 to remain closed keeping voltage supply line 57 at zero volts. At T6 volatile read line 50 goes to −15 volts which causes transistor 16 to be in the conducting state. If the gate electrode 28 of transistor 14 is at −12 volts indicative of a logic zero being stored on capacitor means 18, then transistor 14 will be conducting and data output line 49 will be discharged to zero volts through transistors 16 and 14 and voltage supply line 57. If gate electrode 28 is at zero volts representative of a logic one, then transistor 14 is in the nonconducting state and data output line 49 remains precharged to −12 volts. Therefore, if zero volts or logic one is stored on capacitor means 18, then −12 volts or a logic zero is read out on data output line 49. Memory cell 10 exhibits data inversion which is typical of some random access memory cells since it is a simple matter to invert the output data of the memory chip to remove the data inversion. The data inversion is illustrated in FIG. 3 by waveforms A and B for the voltage on line 47 and waveforms A and B for the voltage on data output line 49 where curve A corresponds to the voltage on line 47 and the output on line 49 and curve B corresponds to the voltage on line 47 and the output on line 49. At T7 volatile read line goes from −15 volts to zero volts causing transistor 16 to be in the nonconducting state which isolates data output line 49 from memory cell 10. Data is valid on data output line 49 from T6 to T7 and beyond until data output line 49 is again precharged to −12 volts or until leakage currents degrade the voltage on line 49.

The volatile data stored on capacitor means 18 may be written into nonvolatile form by varying the voltage threshold of the variable threshold transistor 20. Before data is written into variable threshold transistor 20 it is assumed that the voltage threshold of the variable threshold transistor 20 is at approximately −2 volts which is the clear state. Data may be written into nonvolatile form in memory cell 10 during the time volatile data is being read from memory cell 10 but may not be written during the time volatile data is being written into memory cell 10 because the voltage across capacitor means 18 may be changed during the nonvolatile write. During a nonvolatile write cycle of data into memory cell 10, the associated waveforms for the control lines and data nodes are shown in FIG. 4. At time T8 nonvolatile read line 51 is at zero volts which causes variable threshold transistor 20 to be nonconducting and causes switch 58 to be closed. With switch 58 closed voltage supply line 57 is at zero volts due because voltage supply line 59 is at zero volts. At T8 volatile write line 54 is at zero volts and the data on data input line 53 may be either zero volts or −12 volts with no consequence. Volatile read line 50 may be either zero or −15 volts at time T8. In FIG. 4 precharge line 73, data input line 53, data output line 49 and volatile read line 50 is shown at zero volts for the case where data is not read out during a nonvolatile write operation. At time T8 the data on capacitor means 18 is at zero volts indicative of a logic one and shown in FIG.

4 as the voltage on line 47. At time T9 nonvolatile write line 52 goes from zero volts to −25 volts. Since the voltage on line 47 is at zero volts transistor 14 is in the nonconducting state and line 48 would be floating or negative due to a read operation or is pulled negative at approximately −10 volts, for example, by the drain electrode 46 of variable threshold transistor 20. The drain electrode 46 goes far enough negative to prevent writing of variable threshold transistor 20. In other words, $V_T$ of variable threshold transistor 20 does not change but stays at −2 volts as shown in FIG. 4. At T10 nonvolatile write line 52 goes from −25 volts to zero volts which terminates the nonvolatile memory write operation. Between T10 and T11 it is assumed that the volatile data stored in memory cell 10 has been rewritten to a logic zero or −12 volts. At time T11 the control signals and other circuit voltages are the same as shown at time T8 in FIG. 4 except for the voltage on line 47 which is at −12 volts. At T12 nonvolatile write line 52 goes from zero to −25 volts. The −12 volts on line 47 causes transistor 14 to be in a conducting state which pulls line 48 to zero volts which causes a 25 volt voltage drop to occur between the drain electrode 46 and channel and gate electrode 40 to cause the voltage threshold, $V_T$, of transistor 20 in the region of gate electrode 42 to shift from −2 volts to −10 volts. At time T13 nonvolatile write line 52 goes from −25 volts to zero volts which completes the nonvolatile write operation. Therefore when a logic zero or −12 volts is stored on capacitor means 18 the corresponding nonvolatile data will appear as a shift in the threshold voltage $V_T$ of transistor 20 from −2 volts to −10 volts. When the volatile data on capacitor means 18 is a logic one or zero volts the corresponding data written in nonvolatile form will appear as a threashold voltage $V_T$ of transistor 20 of −2 volts. In the event of power failure and if all the control signals went to zero volts, then so long as nonvolatile write line 52 went from zero to −25 volts, the volatile data on capacitor means 18 could be written into nonvolatile data on transistor 20 as shown in FIG. 4.

The nonvolatile data stored in variable threshold transistor 20 may be transferred from nonvolatile form to volatile form without losing the nonvolatile data utilizing the waveforms shown in FIG. 5. Once the data is transferred to volatile form, the volatile information in memory cell 10 may be read out as shown in FIG. 3 at times T4 through T7. Following transfer of the nonvolatile data to volatile data in capacitor means 18, transistor 20 may be cleared or reset to a threshold voltage of −2 volts to enable new data to be written in at a future time. Non-volatile data may be stored in memory cell 10 without interfering with the storage of volatile data across capacitor means 18. Of course, in the event of power failure the volatile data will be lost but the nonvolatile data may be transferred nondestructively to volatile form across capacitor means 18. Variable threshold transistor 20 may be cleared or reset to a threshold voltage of −2 volts immediately before writing new nonvolatile data into variable threshold transistor 20 or it may be cleared sometime in advance such as after reading out or transferring the nonvolatile data to volatile form.

Referring to FIG. 5, at T14 all control signals and circuit voltages are at zero volts such as would occur in the event of a power failure. At T15 precharge line 73 goes from zero to −15 volts to precharge data output line 49 to −12 volts. Also at T15 nonvolatile read line 51 goes from zero to −15 volts which causes the region under gate electrode 40 of transistor 20 to be conducting and causes switch 58 to open which disconnects voltage supply line 57 from voltage supply line 59 and lets line 57 float. At time T16 precharge line 73 goes from −15 volts to zero volts which causes transistor 69 to be nonconducting. At time T17 volatile read line 50 goes from zero to −15 volts causing transistor 16 to be conducting. Also at T17 nonvolatile write line 52 goes from zero to −6 volts which is midway between the two threshold voltages namely −2 volts and −10 volts of transistor 20 in the region below gate electrode 42. If the threshold voltage in the region below gate electrode 42 is −2 volts, then transistor 20 will be conducting and if the threshold voltage below gate electrode 42 is −10 volts, then transistor 20 will be nonconducting. In FIG. 5 the threshold voltage of gate 42 is shown to be −2 volts for the purpose of describing the operation. With a threshold voltage of −2 volts below gate electrode 42, transistor 20 will be conducting along with transistor 16 which will permit current to flow from line 49 through transistors 16 and 20 to capacitor means 18 which will discharge capacitor means 18 to approximately −12 volts, the voltage of line 49. Precharge line 73 may remain at −15 volts from T16 through T18 to clamp data output line 49 to −12 volts during the time capacitor means 18 may be changed to −12 volts due to the conduction of transistors 16 and 20. Transistor 12 will be nonconducting because of the voltage on gate electrode 22 is zero volts. Transistor 14 may be conducting or nonconducting due to the voltage on gate electrode 28 but since line 57 is floating no current will flow through transistor 14 even if it is conducting to interfere with the charging or discharging of capacitor means 18. At T18 nonvolatile write line 52 goes from −6 volts to zero volts which causes transistor 20 in the region below gate electrode 42 to be nonconducting and volatile read line 50 goes from −15 volts to zero which causes transistor 16 to be nonconducting. With transistor 20 in the nonconducting state, capacitor means 18 is isolated with a charge of −12 volts. At time T19 nonvolatile read line 51 goes from −15 volts to zero volts which causes the region below gate electrode 40 of transistor 20 to be nonconducting and which causes switch 58 to close reconnecting voltage supply line 59 of zero volts to voltage supply line 57 pulling it up to zero volts. The transfer of nonvolatile data to volatile data is now complete and the volatile data may be read out. The method of transferring nonvolatile data to the volatile data resulted in an inversion of the data where volatile data was originally written in transistor 20 as a threshold voltage of −2 volts and was read out as volatile data as −12 volts as shown on line 47 of FIG. 5. The data inversion may be corrected by transferring the inverted volatile data back into nonvolatile data followed by transferring the nonvolatile data to volatile data.

If the threshold voltage below gate electrode 42 of transistor 20 was −10 volts, then at T17 transistor 20 would remain nonconducting and the voltage on line 47 would not be discharged to −12 volts but would remain at zero volts. Thus, when the charge on capacitor means 18 is −12 volts, it appears in nonvolatile form as a threshold voltage of −10 volts in transistor 20 and reread out across capacitor means 18 as zero volts.

Data inversion may be avoided when transferring nonvolatile data to volatile data in memory cell 10 by writing all zeros in volatile form in memory cell 10 so that the voltage across capacitor means 18 is −12 volts. Instead of precharging data output line 49 to −12 volts, clamp data output line 49 to zero volts such as connecting line 74 to zero volts. Then when transistor 16 is conducting and when the region below gate electrode 40 is conducting and a −6 volts is placed on gate electrode 42, if transistor 20 is conducting which would be for the case where its threshold voltage is −2 volts, then capacitor means 18 would be discharged to zero volts. If the threshold voltage of the region below gate electrode 42 was −10 volts, then transistor 20 would be nonconducting and capacitor means 18 would remain at −12 volts. Thus, the nonvolatile data may be transferred to volatile form without data inversion.

Variable threshold transistor 20 may be cleared or reset to a threshold voltage of −2 volts by placing a polarizing voltage on nonvolatile write line 52. Referring to FIG. 5 at time T20 clear operation is accomplished by changing the voltage on nonvolatile write line 52 from zero to +25 volts. At time T21 the nonvolatile write line 52 goes from +25 volts to zero which completes the clear operation. If transistor 20 already has a threshold voltage of −2 volts, nothing will happen where if the transistor had an original −10 volts threshold voltage, then the polarizing voltage will cause the threshold voltage to shift from −10 volts to −2 volts. During volatile operation of memory cell 10 the variable threshold transistor 20 is not used in the circuit. As a consequence, no cycling stress is applied across the gate of the variable threshold transistor 20 such as voltages exceeding 15 volts. In addition, the nonvolatile memory site is independent of the volatile storage site so that nonvolatile data can be stored in memory cell 10 followed by memory cell 10 storing volatile data in the volatile storage site. The variable threshold transistor 20 may be a metal nitride oxide silicon transistor or a metal aluminum oxide oxide silicon transistor. In addition, the variable threshold transistor 20 in the region below gate electrode 42 may be a drain source protected MNOS transistor as described in U.S. Pat. No. 3,836,894 issued on Sept. 17, 1974 and assigned to the assignee herein and in pending application Ser. No. 219,463 filed Jan. 20, 1972, (W.E. Case 43,060) and assigned to the assignee herein which is incorporated by reference herein. It being understood that the region below gate 40 has the characteristics of a fixed threshold transistor such as a P-channel transistor with a threshold voltage of −2 volts.

Figure 6:
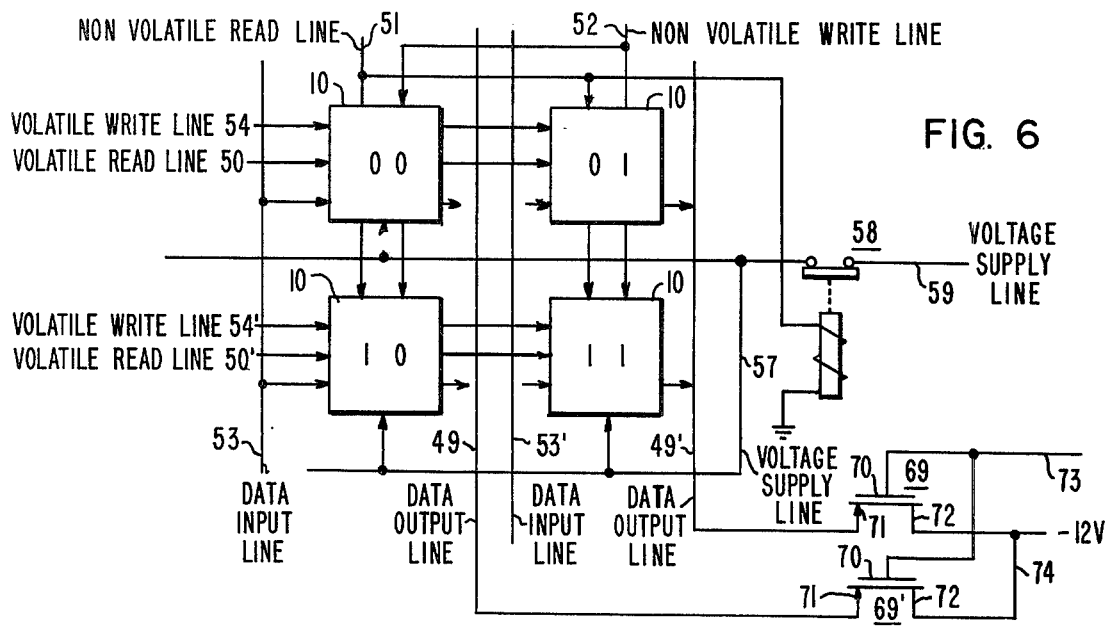
FIG. 6 shows a circuit schematic of a random access memory array utilizing the embodiment of FIG. 1.

Referring now to FIG. 6, a circuit schematic of a random access memory array is shown using a plurality of (four) memory cells 10. In FIG. 6 two rows and two columns of memory cells 10 are shown forming a memory array wherein the rows are designated by X and the columns are designated by Y such that the memory cell location in the array may be designated by XY such as 00 or 01 for row 0, column 0 and for row 0, column 1. In FIG. 6 like references are used for functions corresponding to the apparatus of FIG. 1. The four memory cells in the array in FIG. 6 may be identified as memory cells 00, 01, 10 and 11 corresponding to row X and column Y. Nonvolatile read line 51 is coupled to all four memory cells. Nonvolatile write line 52 is coupled to all four memory cells. Voltage supply line 57 is coupled to all four memory cells. Volatile write line 54 is coupled to memory cells 00 and 01 in row 0. Volatile read line 50 is coupled to memory cells 00 and 01 in row 0. Volatile write line 54' is coupled to memory cells 10 and 11 in row 1. Volatile read line 50' is coupled to memory cells 10 and 11 in column 0. Data input line 53 is coupled to memory cells 00 and 10 in column 0. Data output line 49 is coupled to memory cells 00 and 10 in column 0. Data input line 53' is coupled to memory cells 01 and 11 in column 1. Data output line 49' is coupled to memory cells 01 and 11 in column 1. To write volatile data in the memory cells in row 0 or row 1 either volatile write line 54 or volatile write line 54' must be selected, while the nonselected line remains at zero volts. The waveforms in FIG. 3 from T1 through T3 are utilized. To read volatile data from the memory cells in row 0 or row 1, volatile read line 50 or volatile read line 50' must be selected while the nonselected line remains at zero volts. The selected line and other control signals use the waveforms as shown in FIG. 3 from time T4 through T7. To transfer volatile data to nonvolatile data in the memory cells the waveforms in FIG. 4 from T8 through T10 or from T11 through T13 may be used wherein all memory cells are written with nonvolatile data at the same time.

To read nonvolatile data or transfer data in a memory cell from nonvolatile form to volatile form, the transfer may occur on row 0 or row 1 by selecting either volatile read line 50 or 50' and using the waveforms in FIG. 5 from time T14 through T19. The nonvolatile information in the memory cells 10 in the array may be reset at one time by pulsing line 52 from zero to +25 volts using the waveforms shown in FIG. 5 from times T20 through T21.

The invention provides a random access memory cell for storing information in both volatile and nonvolatile form utilizing at least a volatile read line, nonvolatile read line, nonvolatile write line, first voltage supply line, volatile write line, data input line and data output line comprising: first, second and third field effect transistors each having a gate, source and drain electrode; a capacitor means having a first and second terminal, a dual gate variable threshold transistor means having at least a first and second gate, first source and first drain electrode, the drain electrode of the first transistor coupled to the gate electrode of the second transistor, the first terminal of the capacitor means and the source electrode of the variable threshold transistor, the drain electrode of the second transistor coupled to the source electrode of the third transistor and the drain electrode of the variable threshold transistor, the second terminal of the capacitor means coupled to a reference potential, the volatile read line coupled to the gate electrode of the third transistor, the nonvolatile read line coupled to the first gate electrode of the variable threshold transistor, the nonvolatile write line coupled to the second gate electrode of the variable threshold transistor for coupling a polarizing voltage and at other times a read voltage to the second gate electrode, the first voltage supply line coupled at times to the source electrode of the second transistor, the volatile write line coupled to the gate electrode of the first transistor, the data input line coupled to the source electrode of the first transistor, and the data output line coupled to the drain electrode of the third transistor.

The invention further provides a random access memory array for storing information in both volatile and nonvolatile form comprising a plurality of memory cells wherein each memory cell includes a dual gate variable threshold transistor means and wherein each memory cell is capable of storing information in volatile and nonvolatile form.

I claim:

1. A random access memory cell for storing information in both volatile and nonvolatile form utilizing at least a volatile read line, nonvolatile read line, nonvolatile write line, first voltage supply line, volatile write line, data input line and data output line comprising:
   first, second and third field effect transistors each having a gate, source and drain electrode,
   a capacitor means having a first and second terminal,
   a dual gate variable threshold transistor means having at least a first and second gate, first source and first drain electrode,
   said drain electrode of said first transistor coupled to said gate electrode of said second transistor, said first terminal of said capacitor means and said source electrode of said variable threshold transistor,
   said drain electrode of said second transistor coupled to said source electrode of said third transistor and said drain electrode of said variable threshold transistor,
   said second terminal of said capacitor means coupled to a reference potential,
   said volatile read line coupled to said gate electrode of said third transistor, said nonvolatile read line coupled to said first gate electrode of said variable threshold transistor,
   said nonvolatile write line coupled to said second gate electrode of said variable threshold transistor for coupling a polarizing voltage and at other times a read voltage to said second gate electrode,
   said first voltage supply line coupled at times to said source electrode of said second transistor,
   said volatile write line coupled to said gate electrode of said first transistor,
   said data input line coupled to said source electrode of said first transistor, and
   said data output line coupled to said drain electrode of said third transistor.

2. The random access memory cell of claim 1 wherein said first gate of said variable threshold transistor means includes polysilicon material and said second gate includes metal.

3. The random access memory cell of claim 1 wherein said variable threshold transistor means further includes a second source and a second drain coupled together and located between said first and second gate of said variable threshold transistor means.

4. The random access memory cell of claim 1 wherein said volatile read line is coupled to said nonvolatile read line.

5. The random access memory cell of claim 1 wherein said data input line is coupled to said data output line.

6. A random access memory array for storing information in both volatile and nonvolatile form comprising:
   a plurality of memory cells for storing information in both volatile and nonvolatile form positioned together to form said array having at least a row and a column,
   each of said memory cells including
   a volatile read line, nonvolatile read line, nonvolatile write line, first voltage supply line, volatile write line, data input line and data output line,
   first, second and third field effect transistors each having a gate, source and drain electrode,
   a capacitor means having a first and second terminal,
   a dual gate variable threshold transistor means having at least a first and second gate, first source and first drain electrode,
   said drain electrode of said first transistor coupled to said gate electrode of said second transistor, said first terminal of said capacitor means and said source electrode of said variable threshold transistor,
   said drain electrode of said second transistor coupled to said source electrode of said third transistor and said drain electrode of said variable threshold transistor,
   said second terminal of said capacitor means coupled to a reference potential,
   said volatile read line coupled to said gate electrode of said third transistor, said nonvolatile read line coupled to said first gate electrode of said variable threshold transistor,
   said nonvolatile write line coupled to said second gate electrode of said variable threshold transistor for coupling a polarizing voltage and at other times a read voltage to said second gate electrode,
   said first voltage supply line coupled at times to said source electrode of said second transistor,
   said volatile write line coupled to said gate electrode of said first transistor,
   said data input line coupled to said source electrode of said first transistor, and
   said data output line coupled to said drain electrode of said third transistor.

7. The random access memory array of claim 6 wherein said volatile write lines are coupled together and said volatile read lines are coupled together of said memory cells in a row of said array.

8. The random access memory array of claim 6 wherein said nonvolatile read lines are coupled together, said nonvolatile write lines are coupled together and said voltage supply lines are coupled together of all of said memory cells in said array.

9. The random access memory array of claim 6 wherein said data input lines are coupled together and said data output lines are coupled together of said memory cells in a column of said array.

* * * * *